(12) United States Patent
Moncavage

(10) Patent No.: US 9,138,841 B2
(45) Date of Patent: Sep. 22, 2015

(54) PIN LOCKING SUPPORT FIXTURE

(75) Inventor: Charles Moncavage, Nazareth, PA (US)

(73) Assignee: Quik-tool, LLC, Plainville, MA (US)

( * ) Notice: Subject to any disclaimer, the term of this patent is extended or adjusted under 35 U.S.C. 154(b) by 593 days.

(21) Appl. No.: 13/639,277

(22) PCT Filed: Apr. 4, 2011

(86) PCT No.: PCT/US2011/000600
§ 371 (c)(1),
(2), (4) Date: Oct. 4, 2012

(87) PCT Pub. No.: WO2011/126559
PCT Pub. Date: Oct. 13, 2011

(65) Prior Publication Data
US 2013/0032984 A1 Feb. 7, 2013

Related U.S. Application Data

(60) Provisional application No. 61/320,903, filed on Apr. 5, 2010.

(51) Int. Cl.
B23Q 3/00 (2006.01)
B23Q 1/03 (2006.01)
H05K 13/00 (2006.01)
B25B 11/00 (2006.01)

(52) U.S. Cl.
CPC .............. *B23Q 1/035* (2013.01); *B25B 11/002* (2013.01); *H05K 13/0069* (2013.01)

(58) Field of Classification Search
USPC .......................................................... 269/296
See application file for complete search history.

(56) References Cited

U.S. PATENT DOCUMENTS

| | | | |
|---|---|---|---|
| 6,202,999 B1 * | 3/2001 | Wayman et al. | 269/309 |
| 6,702,272 B2 | 3/2004 | Monvavage | |
| 6,711,797 B1 | 3/2004 | Bennett et al. | |
| 6,726,195 B1 * | 4/2004 | Hertz et al. | 269/266 |

(Continued)

FOREIGN PATENT DOCUMENTS

| | | |
|---|---|---|
| EP | 1631138 A2 | 3/2006 |
| WO | WO 0030804 A1 * | 6/2000 |
| WO | WO2004004978 A1 | 1/2004 |

OTHER PUBLICATIONS

International Search Report and Written Opinion for PCT/US2011/000600, Sep. 15, 2011.

*Primary Examiner* — Lee D Wilson
*Assistant Examiner* — Alvin Grant
(74) *Attorney, Agent, or Firm* — Maenner & Associates LLC; Joseph E. Maenner

(57) ABSTRACT

A pin locking apparatus 100 includes a base unit 101 having a plurality of vertical channels 120 formed therethrough. A first pin 122 is slidingly disposed in a first of the plurality of vertical channels 120 and a second pin 122 is slidingly disposed in a second of the plurality of vertical channels 120. A wedge 140 is slidingly disposed in a third of the plurality of vertical channels 142. The third vertical channel 142 is located between the first and second vertical channels 120. A first magnet 132 is slidingly disposed in a horizontal channel 130 between the first pin 122 and the wedge 140. A second magnet 132 is slidingly disposed in the horizontal channel 130 between the second pin 122 in the wedge 140. The magnetic pole of the second magnet 132 proximate to the wedge 140 is opposite the magnetic pole of the first magnet 132 proximate to the wedge 140.

20 Claims, 7 Drawing Sheets

(56) References Cited

U.S. PATENT DOCUMENTS

| | | | |
|---|---|---|---|
| 6,749,054 B2 * | 6/2004 | Gordon et al. | 198/345.2 |
| 6,898,837 B1 | 5/2005 | Bennett et al. | |
| 7,093,704 B2 * | 8/2006 | Gordon et al. | 198/345.2 |
| 8,505,178 B2 * | 8/2013 | Farlow et al. | 29/281.1 |
| 8,770,567 B2 * | 7/2014 | Piggott et al. | 269/266 |
| 8,850,695 B1 * | 10/2014 | Call et al. | 29/739 |
| 2002/0050672 A1 | 5/2002 | Moncavage | |
| 2006/0244190 A1 * | 11/2006 | Erdmann | 269/266 |

\* cited by examiner

PIN LOCKING SUPPORT FIXTURE

CROSS-REFERENCE TO RELATED APPLICATION

The present application is a U.S. National Stage Application of PCT Application Serial No. PCT/US2011/000600, filed on Apr. 4, 2011, which claims priority from U.S. Provisional Patent Application Ser. No. 61/320,903, filed on Apr. 5, 2010, both of which are incorporated by reference in their entireties.

FIELD OF INVENTION

The present invention relates to a fixture that is used to support a substrate having an uneven lower face while operations are performed on the top face of the substrate.

BACKGROUND

Support fixtures are used to support substrates, such as, for example printed circuit (PC) boards, during their manufacture. Many PC boards include chips, resistors, and other elements on both sides of the board, which are typically installed a first side of the board, and then on an opposing side of the board. After these elements have been inserted on the first side of the board, the board is flipped over and supported by the first side. Support members on the support fixture project away from the base of the support fixture and engage the elements and the board, thereby supporting the board so that additional elements can be installed on the second side of the board.

Several patents disclose support fixtures with independently movable support members to engage board elements and boards, such as, for example, U.S. Pat. No. 6,702,272, which uses a ball to lock a respective pin in a desired support position. This fixture requires a complex sequence of low pressure air, high pressure air, and vacuum to set the support members, and then release the support members to reset the fixture. Additionally, the force applied by the ball to the pin may not always be sufficiently high enough to maintain the pin in its desired support position when a board element is placed onto the pin.

It would be beneficial to provide a board support fixture that requires a less complex sequence of operation to set and then reset the fixture, as well as a fixture that applies a higher force to each pin to ensure that the pin is maintained in its desired support position while the PC board is being worked on.

BRIEF DESCRIPTION OF THE INVENTION

Briefly, the present invention provides pin locking apparatus comprising a base plate having a vertical passage having an open vertical end, a transverse passage being in fluid communication with the vertical passage, and a longitudinal passage having an open longitudinal end. The longitudinal passage is in fluid communication with the transverse passage. A pin is slidably disposed in the vertical passage and extending outwardly from the open vertical end. A magnet is slidably disposed in the transverse passage between a pin locking position wherein the magnet engages the pin and urges the pin against the base plate and a pin unlocking position wherein the pin is free to slide along the vertical passage. A means for attracting the magnet is disposed in the transverse passage, away from the pin. A wedge is disposed between the magnet and the means for magnetically attracting the magnet. The wedge is slidably disposed between a magnet locking position, wherein the wedge engages the magnet and urges the magnet against the pin and a magnet unlocking position wherein the magnet is biased away from the pin by the means for magnetically attracting the magnet.

The wedge comprises a wedge piston in fluid communication with the longitudinal passage. The means for magnetically attracting the magnet comprises a second magnet. The base plate is symmetrical about a vertical plane extending along the longitudinal passage. The apparatus further comprises a pin lifting fluid passage in fluid communication with the vertical passage, away from the open vertical end. The pin lifting fluid passage comprises a first fluid connection. The pin comprises a chamfered bottom portion.

Additionally, the present invention provides a pin locking apparatus having a base unit having a plurality of vertical channels formed therethrough. A first pin is slidingly disposed in a first of the plurality of vertical channels and a second pin is slidingly disposed in a second of the plurality of vertical channels. A wedge is slidingly disposed in a third of the plurality of vertical channels. The third vertical channel is located between the first and second vertical channel. A first magnet is slidingly disposed in a horizontal channel between the first pin and the wedge. A second magnet is slidingly disposed in the horizontal channel between the second pin in the wedge. The magnetic pole of the second magnet proximate to the wedge is opposite the magnetic pole of the first magnet proximate to the wedge.

The wedge is biased away from the horizontal channel. The pin locking apparatus further comprises a first biasing member disposed in the first vertical channel below the first pin. The first vertical channel and the second vertical channel fluidly communicate with each other. The first and second vertical channels are fluidly communicable with a first pressurized fluid source. The third vertical channel is fluidly communicable with a second pressurized fluid source. Each of the first pin and the second pin comprises a chamfered bottom portion. The base unit comprises a lower portion containing the plurality of vertical channels and an upper portion containing the horizontal channel.

Further, the present invention provides a pin locking apparatus comprising a base unit having a plurality of vertical channels and a horizontal channel extending therethrough such that the horizontal channel in fluid communication with a first vertical channel, a second vertical channel, and a third vertical channel. A first pin is slidingly disposed in the first vertical channel, a second pin is slidingly disposed in the second vertical channel, and a wedge is slidingly disposed in the third vertical channel between the first and second vertical channels. A first locking device is disposed in the horizontal channel between the first vertical channel and the third vertical channel. The first locking device is sufficiently long to engage the first pin against the base unit when the wedge is in an upward position. A second locking device is disposed in the horizontal channel between the second vertical channel and the third vertical channel. The second locking device is sufficiently long enough to engage the second pin against the base unit when the wedge is in the biasing position.

The first locking device comprises a magnet. The wedge is biased toward a downward position. The first and second vertical channels are in fluid communication with a first pressurized fluid supply port. The third vertical channel is in fluid communication with a second pressurized fluid supply port.

BRIEF DESCRIPTION OF THE DRAWINGS

The foregoing summary, as well as the following detailed description of the invention, will be better understood when read in conjunction with the appended drawings. For the purpose of illustrating the invention, there is shown in the drawing certain embodiments of the present invention. It should be understood, however, that the invention is not limited to the precise arrangements shown. In the drawings.

DETAILED DESCRIPTION OF THE PREFERRED EMBODIMENTS

Figure 1:
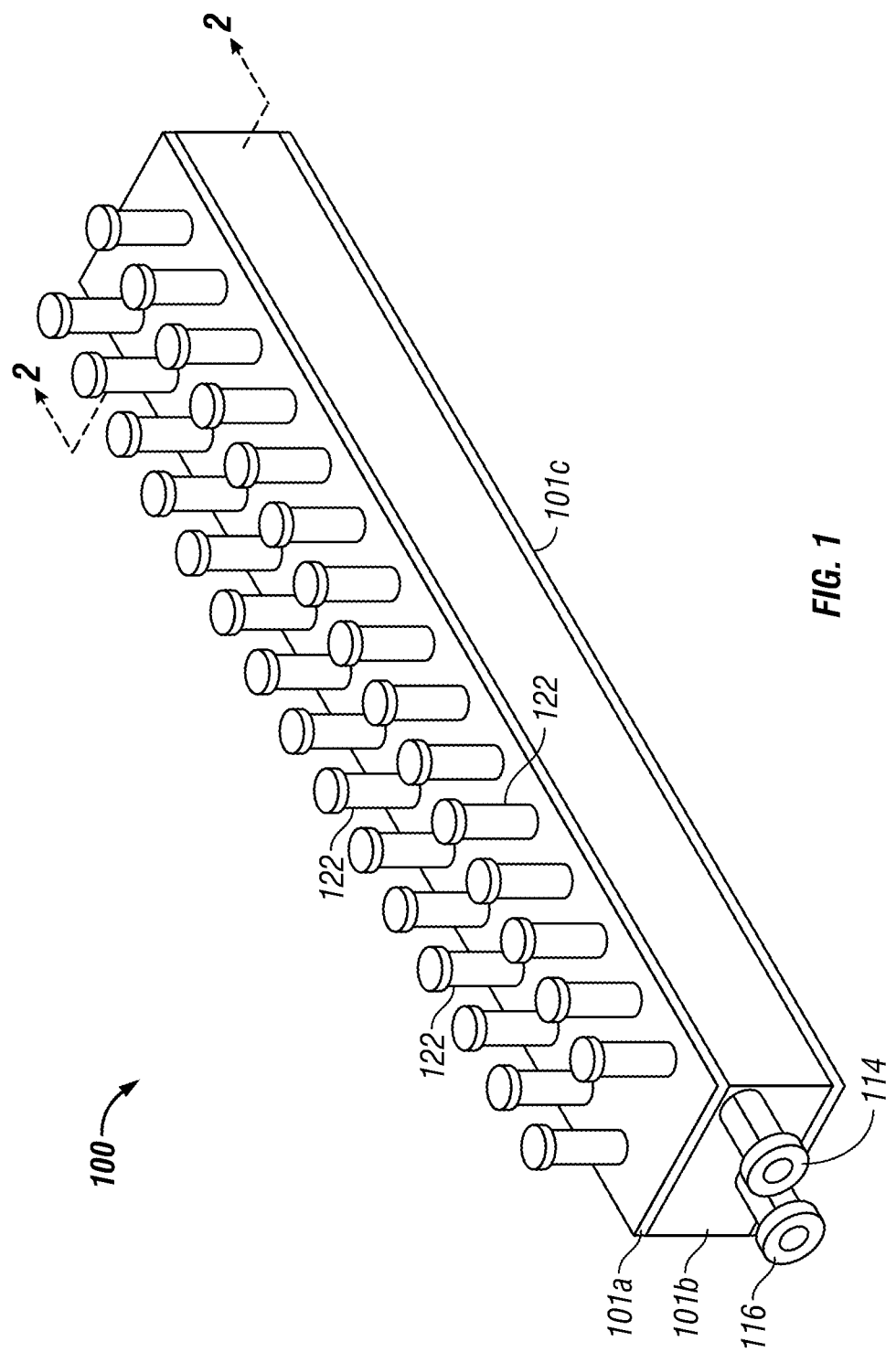
FIG. 1 is a perspective view of a support fixture according to an exemplary embodiment of the present invention.

In describing the embodiments of the invention illustrated in the drawings, specific terminology will be used for the sake of clarity. However, the invention is not intended to be limited to the specific terms so selected, it being understood that each specific term includes all technical equivalents operating in similar manner to accomplish similar purpose. It is understood that the drawings are not drawn exactly to scale.

The following describes particular embodiments of the present invention. It should be understood, however, that the invention is not limited to the embodiments detailed herein. Generally, the following disclosure refers to support fixtures that are used to support a substrate while operations are performed on the substrate.

Referring to FIGS. 1-4A, a support fixture 100 according to a first embodiment of the present invention is disclosed. Support fixture 100 is used to support a generally planar work piece, such as, for example, a PC board 50, along with elements such as, for example, chips 52, during its fabrication. While a PC board 50 is used as the exemplary work piece throughout this disclosure, those skilled in the art will recognize that other types of work pieces such as, for example, aircraft fuselage pieces or ship hull pieces, may be used on a larger scale.

Support fixture 100 is a generally parallelepiped base plate 101 having a top surface 102, an opposing bottom surface 104, and generally orthogonal sides 106, 108, 110, 112. Base plate 101 may include a plurality of plates 101a, 101b, 101c that are stacked on top of each other and secured to one another, such as with screws (not shown), for example, in order to be able to machine internal passages that extend within and through base plate 101. Base plate 101 supports a plurality of support pins 122 that extend vertically through base plate 101. While FIG. 1 shows two rows of fifteen (15) support pins 122, those skilled in the art will recognize that different numbers of support pins 122 may be used.

Figure 4:
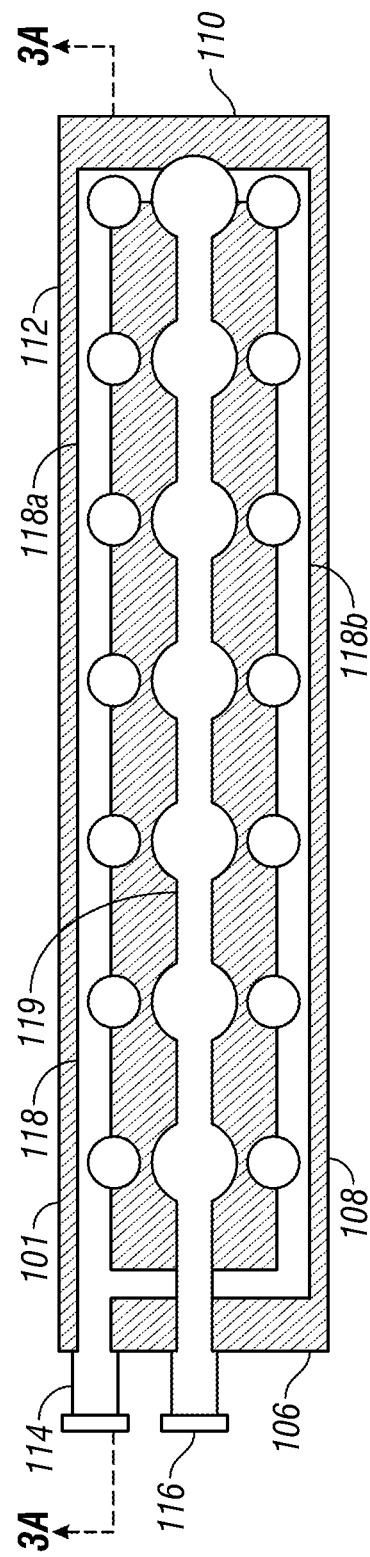
FIG. 4 is top view, in section, of air passages formed in the support fixture of FIG. 1.
Figure 4A:
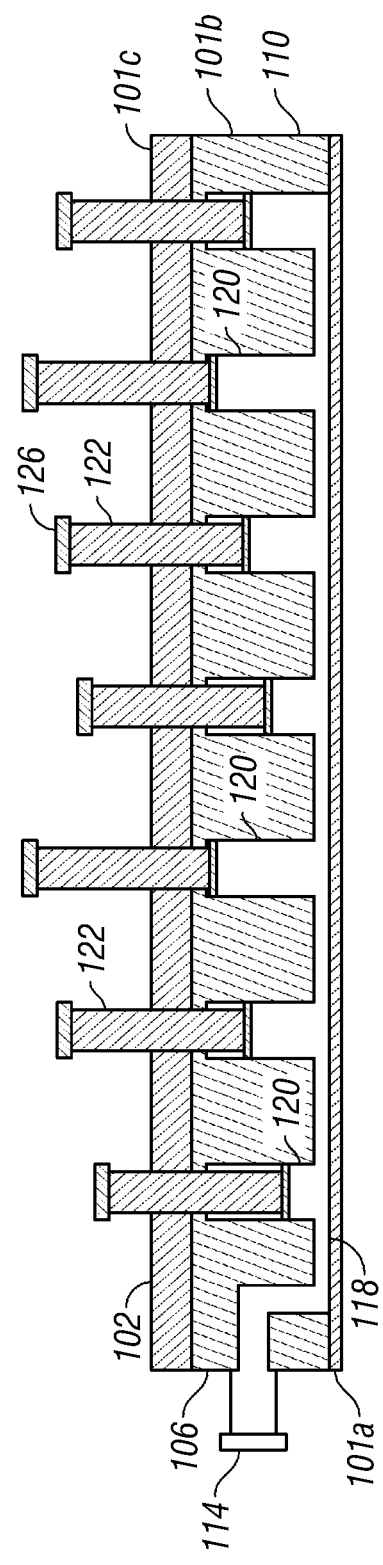
FIG. 4A a side elevational view, in section, of the support fixture shown in FIG. 4.

Referring to FIGS. 4 and 4A, base plate 101 may include pin port 114 and wedge port 116 to facilitate connection of pressurized fluid to support fixture 100 to operate support fixture 100. In this exemplary embodiment, pin port 114 and wedge port 116 are located on the same side (side 106) of base plate 101. Alternatively, although not shown, pin port 114 may be located on side 106 while wedge port 116 may be located on another of sides 108, 110, 112.

Pin port 114 is in fluid communication with a pin air channel 118 that extends from pin port 114 in side 106 toward, but does not extend through, opposing side 110. Pin air channel 118 forms a plurality of generally parallel pin air channels 118a and 118b that are in fluid communication with each other. Similarly, wedge port 116 is in fluid communication with a wedge air channel 119 that splits into a single wedge air channel 119. While, in the exemplary embodiment, two pin air channels 118a and 118b, as well as a single wedge air channel 119 are shown, those skilled in the art will recognize that more than two pin air channels 118a and 118b and a single wedge air channel 119 can be used. In such embodiments, not shown, however, each wedge air channel 119 corresponds to two pin air channels 118 that are located on either side of wedge air channel 119 such that there are half as many wedge air channels 119 as pin air channels 118.

Base plate 101 includes an array of vertical pin passages 120 that are generally evenly disposed in rows and columns along top surface 102 of base plate 101 and in fluid communication with one of pin air channels 118a or 118b. Each pin passage 120 has an open end at top surface 102 of base plate 101. Alternatively, instead of a main pin air channel 118 with a plurality of pin air channels 118a and 118b extending therefrom, a single air channel (not shown) may serially connect to each pin passage 120. Still alternatively, a single chamber (not shown) may provide fluid communication between pin port 106 and all of pin passages 120.

A support pin 122 is slidably disposed within each pin passage 120 and extends outwardly from the open end at top surface 102 of base plate 101. Support pins 122 are used to support PC board 50 and chips 52 away from top surface 102 of base plate 101.

Each support pin 122 includes an elongated cylindrical shaft 124. Shaft 124 may be constructed from a non-magnetic material such as, for example, aluminum or brass. Shaft 124 includes a cap 126 at a top end thereof. Cap 126 may be constructed from a soft, generally pliable material such as, for example, plastic or a compliant rubber. Cap 126 may be inserted into an opening 127 (shown in FIG. 2B) in the top of shaft 124. As illustrated in FIG. 3, cap 126 engages PC board 50 and chips 52. A bottom end 128 of shaft 124 is enlarged such that bottom end 128 is larger than a portion of pin passage 120 so that support pin 122 is maintained within pin passage 120.

Figure 2:
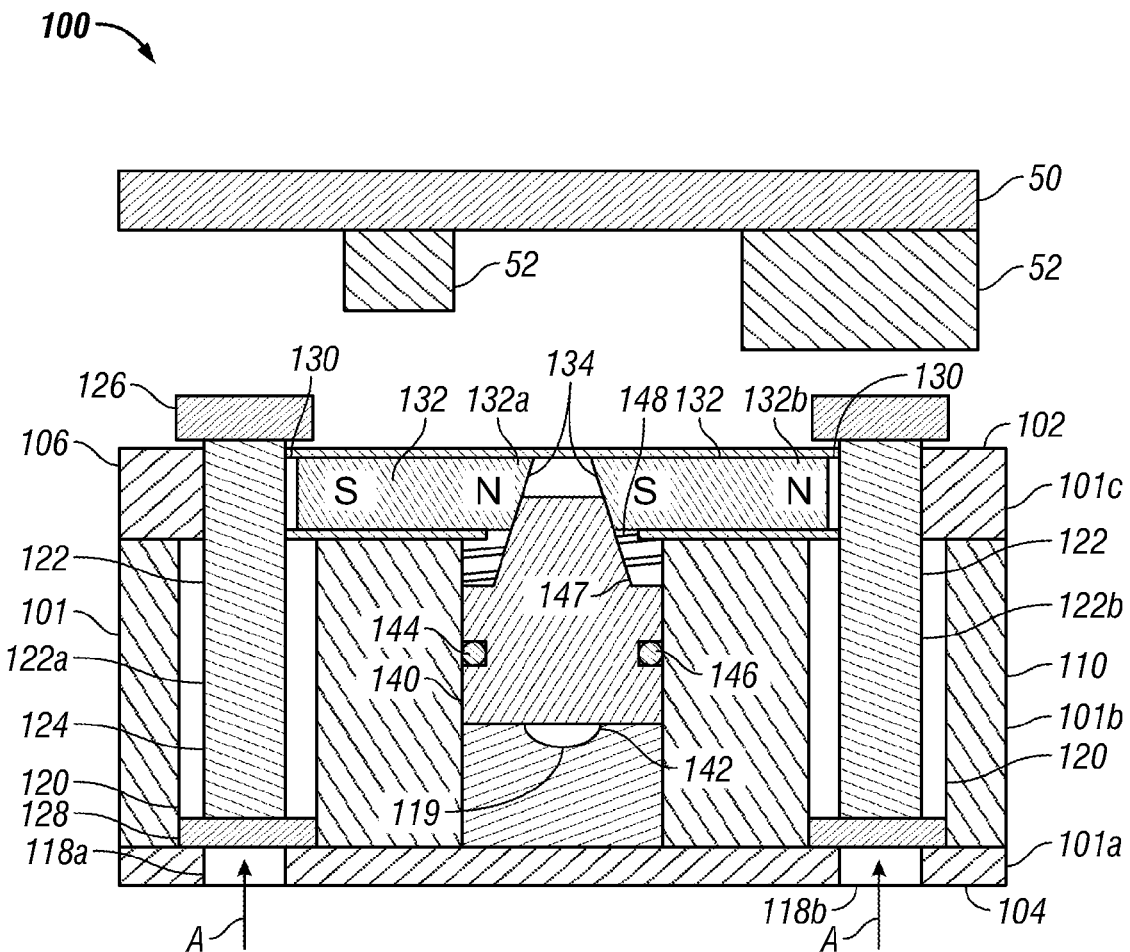
FIG. 2 is a sectional view of the support fixture shown in FIG. 1, with the support fixture in a released condition, and with a printed circuit (PC) board located over the top of the support fixture.
Figure 2B:
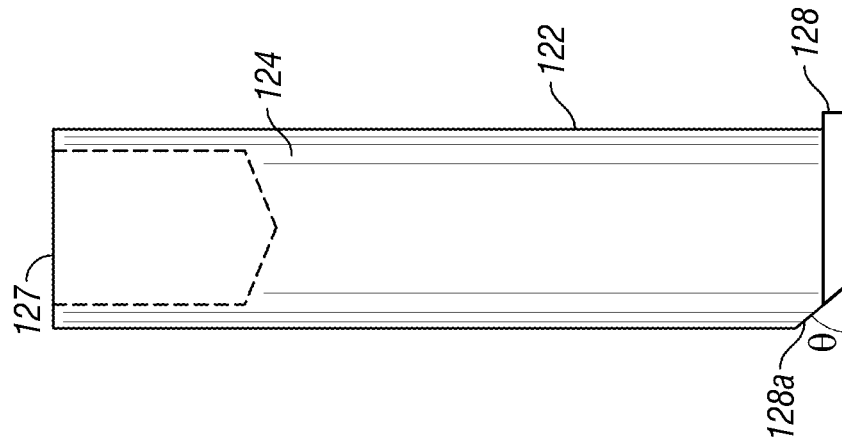
FIG. 2B is a side elevation view of a second exemplary embodiment of a pin used with the support fixture shown in FIG. 2.
Figure 2A:
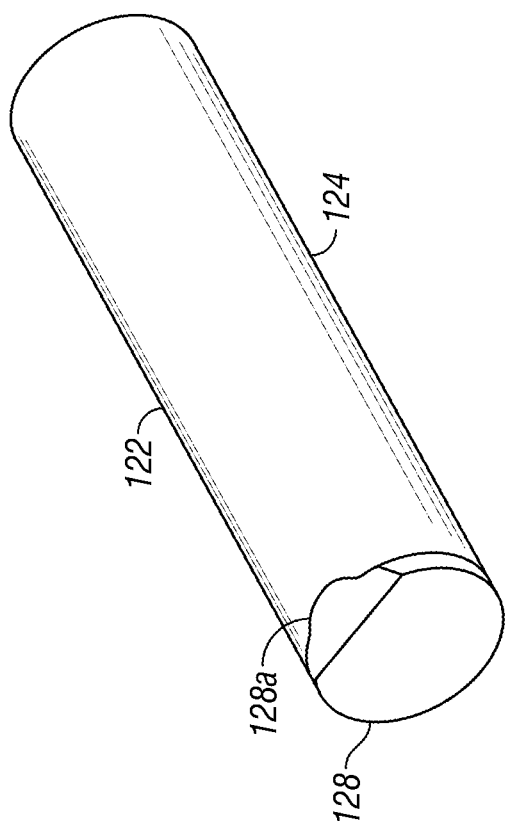
FIG. 2A is a perspective view of the pin shown in FIG. 2.
Figure 3:
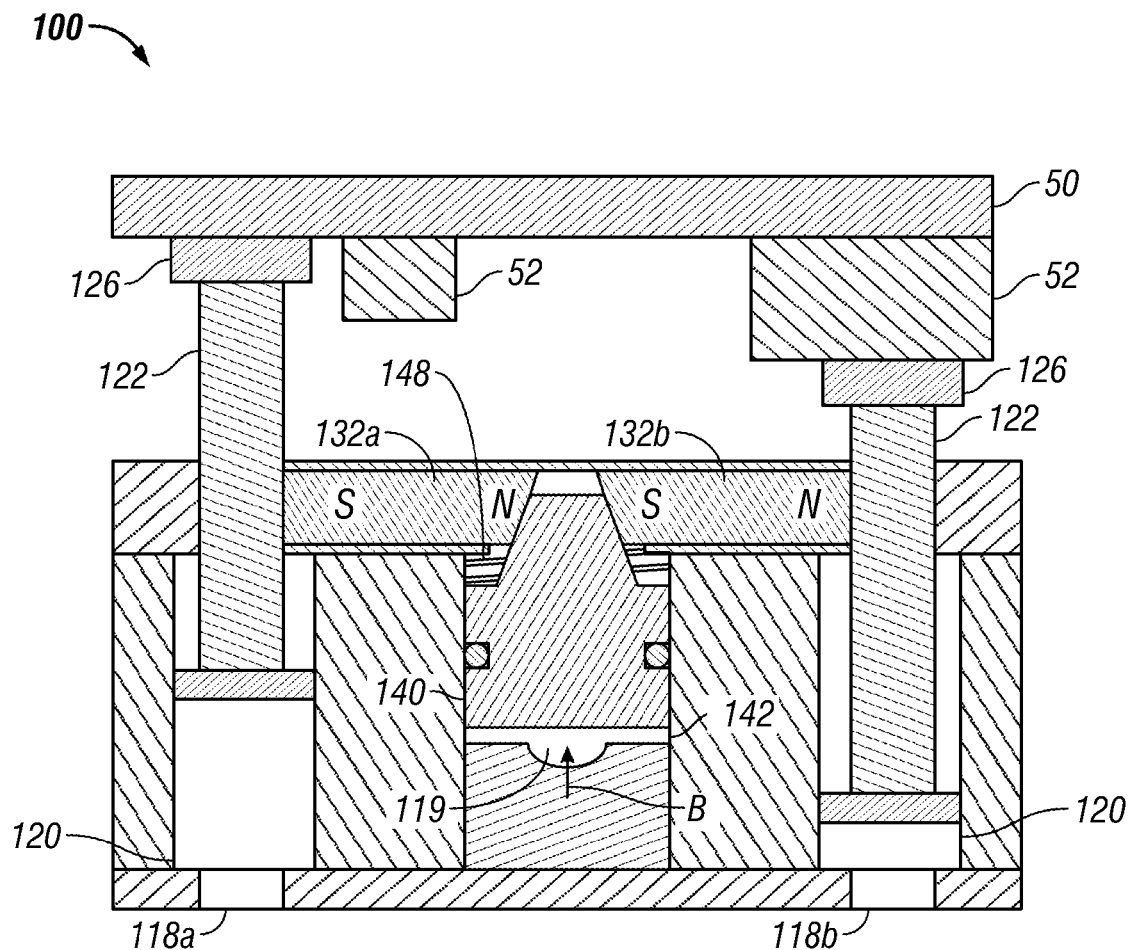
FIG. 3 is a cutaway view of the support fixture of FIG. 2, with the support fixture in a fixed condition.

Optionally, bottom end 128 of each support pin 122 may include a chamfered portion 128a as shown in FIGS. 2A and 2B. Chamfered portion 128a allows a small portion of pressurized fluid in pin air channel 118 to pass around support pin 122. By allowing the pressurized fluid to pass around support pin 122, the pressure of the pressurized fluid does not build up sufficiently to bind support pin 122, which may possibly keep support pin 122 from dropping in pin passage 120 when the pressurized fluid is released. In an exemplary embodiment, chamfered portion 128a extends in an arc of about 60 degrees around the circumference of bottom end 128 and extends at an angle ⊖ of about 50°.

Referring to FIGS. 2 and 3, a generally cylindrical magnet 132 is slidably disposed within each transverse passage 130. Each magnet 132 may be moved between a pin locking position in which magnet 132 drives a respective shaft 124 against the wall of its pin passage 120 to set the height of pin 122

(shown in FIG. 3) and a pin unlocking position wherein pin 122 is free to slide along vertical pin passage 120 (shown in FIG. 2).

A non-magnetic wedge 140 may be used to drive two adjacent magnets 132 away from each other to secure their respective pins 122. Wedge 140 is located in a wedge passage 142 that is in fluid communication with wedge port 116. Wedge 140 includes a circumferential ridge 144 into which an o-ring 146 is inserted. O-ring 146 provides a seal between wedge 140 and the wall of wedge passage 142 so that fluid, such as, for example, pressurized air, provided into wedge passage 142 from wedge port 116 does not leak out of wedge passage 142. In an exemplary embodiment, fixture 100 operates with a supply of between about 50 and about 80 pounds per square inch (between about 3.45 and about 5.52 bars) of pressurized fluid.

Wedge 140 may include a tapered top portion 147 having a smaller top and a larger bottom. Magnet 132 may include a tapered face 134 that matches the taper of tapered top portion 147 of wedge 140 in order to provide surface-to-surface contact between magnet 132 and wedge 140. In an exemplary embodiment, tapered face 134 is tapered at an angle of between about 7 degrees and about 22.5 degrees, and, desirably, about 15 degrees from vertical. The matching tapered surfaces reduce wear to wedge 140 and magnet 132 where magnet 140 and wedge 132 engage each other. Optionally, tapered face 134 on magnet 132 may be omitted. Further, tapered face 134 has a larger surface area than the bottom of wedge 140, which results in a mechanical advantage of about 3.7:1. This means that, for a fluid force applied upward to the bottom of wedge 140 through wedge passage 142, a horizontal force of 3.7 times the applied force is applied by tapered face 134 to each magnet 132 and, correspondingly, to each respective pin 122.

A biasing member, such as, for example, a helical spring 148, is located around tapered top portion 147, between the body of wedge 140 and magnets 132. Helical spring 148 biases wedge 140 downward, away from magnets 132, when pressurized fluid is not applied to wedge 140 from wedge port 116.

Adjacent magnets 132 that are separated by a mutual wedge 140 are installed in fixture 100 so that opposite poles are facing wedge 140. As shown in FIGS. 2 and 3, the north pole of magnet 132a is facing wedge 140 while the south pole of magnet 132b is facing wedge 140. The attraction of the opposing poles of magnets 132a and 132b causes magnets 132a and 132b to retract toward each other and away from their respective pins 122a, 122b when wedge 140 is retracted (lowered). This feature eliminates the need for a separate biasing member to bias the pin locking elements away from pins 132 when wedge 140 is retracted (lowered).

The mechanical advantage of wedge 140 against magnets 132, forcing magnets 132a, 132b apart from each other, increases the frictional locking force of magnets 132 against their respective pin 122, compared to a prior art direct-acting piston of the same surface area and working fluid pressure.

Multiple support pins 122 are locked by a single wedge 140. As shown in FIG. 3, two pins 122a, 122b are locked by a single wedge 140. This configuration reduces the complexity of fixture 100 as well as eliminates potential leaking fluid seals in a system where each pin is locked by its own locking piston.

Further, with the present invention, the size of the pin locking element, in this embodiment, magnet 140, is reduced compared to prior art devices having a similar locking force. This feature improves the available stroke of pin 122 in a given base plate 101 size, allowing for increased range in topography heights of PC board 50.

Alternatively, a single support pin 122 can be locked by a single wedge 140 that drives a single magnet 132 against support pin 122. In order to bias magnet 132 away from support pin 122 when it is desired to allow support pin 122 to retract, a fixed magnet (not shown) may be inserted into transverse passage 130 such that wedge 140 is located between magnet 132 and the fixed magnet.

To operate fixture 100, PC board 50 is moved to a position over fixture 100. Fluid pressure is directed from pin port 114 to pin passage 120 through pin passages 118a and 118b, as shown by arrow A in FIG. 2 to raise pins 122 such that each pin 122 engages PC board 50. As shown in FIG. 3, different pins 122a, 122b may be raised to different heights, depending on the topography of the bottom surface of PC board 50.

Once pins 122 are in position, fluid pressure is routed through wedge port 116 to wedge passage 142 through wedge air channel 119, thereby moving wedge 140 upward, as indicated by arrow B in FIG. 3, and driving magnets 132a, 132b away from each other and against their respective pins 122a, 122b to lock pins 122a, 122b into position for as long as fluid pressure is applied to wedge passage 142. Once pins 122a, 122b are locked, fluid pressure may be removed from pin passages 120. This fluid pressure may be released out of pin port 114 to discharge the fluid away from fixture 100.

After operations on PC board 50 are completed, fluid pressure is removed from wedge passage 142 and exhausted from fixture 100 through wedge port 116. Biasing member 148 biases wedge 140 downward into wedge passage 142 and the magnetic attraction between magnets 132a, 132b directs magnets 132a, 132b toward each other, releasing their respective pins 122a, 122b, and allowing pins 122a, 122b to drop through their respective pin passages 120 until bottom end 128 of each pin shaft 124 engages the narrow portion of its respective pin passage 120.

Regulation of pressurized fluid through pin port 114 and wedge port 116 may be accomplished by a programmable logic controller (not shown), and timed to operate in parallel with the movement of PC boards 50 being manufactured along an assembly line. The pressurized fluid may be air that is provided via an air compressor (not shown) or some other pressurized fluid source. Pressurized fluid that is exhausted from fixture through pin port 114 and wedge port 116 may be exhausted directly to atmosphere.

Figure 5:
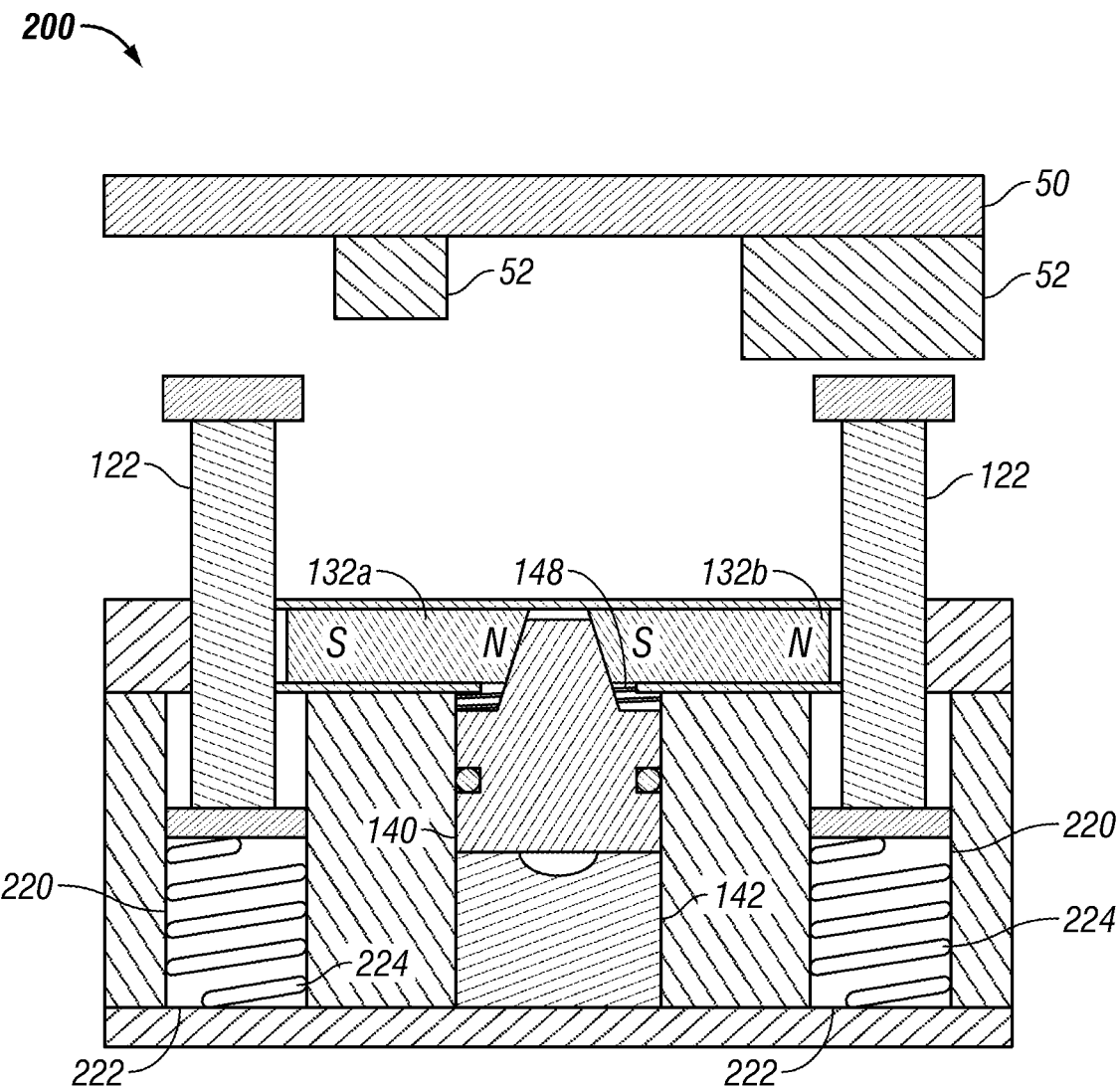
FIG. 5 is a cutaway view of a support fixture according to another exemplary embodiment of the present invention, with the support fixture in a released condition.
Figure 6:
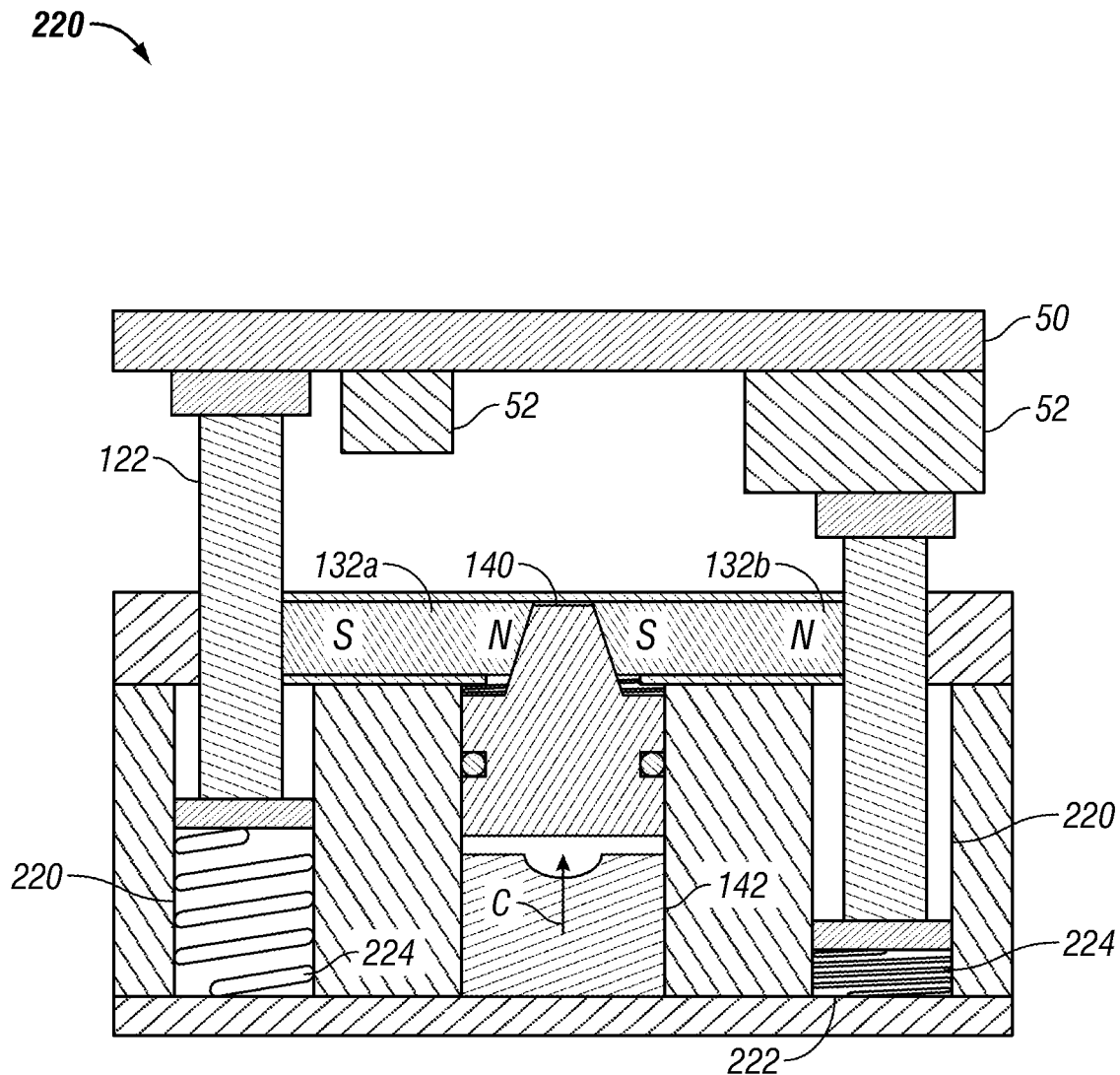
FIG. 6 is a cutaway view of the support fixture of FIG. 5, with the support fixture in a fixed condition.

An alternative embodiment of a fixture 200 is illustrated in FIGS. 5 and 6. Fixture 200 is structurally similar to and operates similar to fixture 100 with the following exceptions. Pin passage 220 is not in fluid communication with a pressurized fluid source. Pin passage 220 includes a closed bottom 222. A biasing member 224, such as, for example, a helical spring, is located in pin passage 220 below pin 122 and biases pin 122 upward.

In operation, PC board 50 is moved over fixture 200 and lowered onto pins 122, displacing pins 122 until pins 122 are in desired contact with PC board 50 and/or chips 52. Pressurized fluid is provided to wedge passage 142 through wedge fixture 116, as shown by arrow C in FIG. 6, forcing wedge 140 upward, thereby driving magnets 132a, 132b apart from each other and locking their respective pins 122a, 122b into position within pin passage 220.

After operations on PC board 50 are completed, PC board is lifted from pins 122. Fluid pressure is released from wedge passage 142, allowing biasing member 148 to bias wedge 140 downward into wedge passage 142. Magnets 132a, 132b are attracted toward each other, releasing pins 122a, 122b, and allowing biasing members 224a, 224b to bias pins 122a, 122b to return to their unlocked position. This process is repeated for subsequent PC boards 50.

While the principles of the invention have been described above in connection with preferred embodiments, it is to be clearly understood that this description is made only by way of example and not as a limitation of the scope of the invention.

What is claimed is:

1. A pin locking apparatus comprising:
   a base plate having a vertical passage having an open vertical end, a transverse passage being in fluid communication with the vertical passage, and a longitudinal passage having an open longitudinal end, the longitudinal passage being in fluid communication with the transverse passage;
   a pin slidably disposed in the vertical passage and extending outwardly from the open vertical end;
   a magnet slidably disposed in the transverse passage between:
      a pin locking position wherein the magnet engages the pin and urges the pin against the base plate; and
      a pin unlocking position wherein the pin is free to slide along the vertical passage;
   a means for attracting the magnet disposed in the transverse passage, away from the pin; and
   a wedge disposed between the magnet and the means for magnetically attracting the magnet, the wedge being slidably disposed between:
      a magnet locking position wherein the wedge engages the magnet and urges the magnet against the pin; and
      a magnet unlocking position wherein the magnet is biased away from the pin by the means for magnetically attracting the magnet.

2. The pin locking apparatus according to claim 1, wherein the wedge comprises a wedge piston in fluid communication with the longitudinal passage.

3. The pin locking apparatus according to claim 1, wherein the means for magnetically attracting the magnet comprises a second magnet.

4. The pin locking apparatus according to claim 3, wherein the base plate is symmetrical about a vertical plane extending along the longitudinal passage.

5. The pin locking apparatus according to claim 1, further comprising a pin lifting fluid passage in fluid communication with the vertical passage, away from the open vertical end.

6. The pin locking apparatus according to claim 5, wherein the pin lifting fluid passage comprises a first fluid connection.

7. The pin locking apparatus according to claim 1, wherein the pin comprises a chamfered bottom portion.

8. A pin locking apparatus comprising:
   a base unit having a plurality of vertical channels formed therethrough;
   a first pin slidingly disposed in a first of the plurality of vertical channels;
   a second pin slidingly disposed in a second of the plurality of vertical channels;
   a wedge slidingly disposed in a third of the plurality of vertical channels, the third vertical channel being located between the first and second vertical channel;
   a first magnet slidingly disposed in a horizontal channel between the first pin and the wedge; and
   a second magnet slidingly disposed in the horizontal channel between the second pin in the wedge, wherein the magnetic pole of the second magnet proximate to the wedge is opposite the magnetic pole of the first magnet proximate to the wedge.

9. The pin locking apparatus according to claim 8, wherein the wedge is biased away from the horizontal channel.

10. The pin locking apparatus according to claim 8, further comprising a first biasing member disposed in the first vertical channel below the first pin.

11. The pin locking apparatus according to claim 8, wherein the first vertical channel and the second vertical channel fluidly communicate with each other.

12. The pin locking apparatus according to claim 8, wherein the first and second vertical channels are fluidly communicable with a first pressurized fluid source.

13. The pin locking apparatus according to claim 9, wherein the third vertical channel is fluidly communicable with a second pressurized fluid source.

14. The pin locking apparatus according to claim 8, wherein each of the first pin and the second pin comprises a chamfered bottom portion.

15. The pin locking apparatus according to claim 8, wherein the base unit comprises a lower portion containing the plurality of vertical channels and an upper portion containing the horizontal channel.

16. A pin locking apparatus comprising:
   a base unit having a plurality of vertical channels and a horizontal channel extending therethrough such that the horizontal channel is in fluid communication with a first vertical channel, a second vertical channel, and a third vertical channel;
   a first pin slidingly disposed in the first vertical channel;
   a second pin slidingly disposed in the second vertical channel;
   a wedge slidingly disposed in the third vertical channel, the third vertical channel being located between the first and second vertical channels;
   a first locking device disposed in the horizontal channel between the first vertical channel and the third vertical channel, the first locking device being sufficiently long to engage the first pin against the base unit when the wedge is in an upward position; and
   a second locking device disposed in the horizontal channel between the second vertical channel and the third vertical channel, the second locking device being sufficiently long enough to engage the second pin against the base unit when the wedge is in a biasing position.

17. The pin locking apparatus according to claim 16, wherein the first locking device comprises a magnet.

18. The pin locking apparatus according to claim 16, wherein the wedge is biased toward a downward position.

19. The pin locking apparatus according to claim 16, wherein the first and second vertical channels are in fluid communication with a first pressurized fluid supply port.

20. The pin locking apparatus according to claim 19, wherein the third vertical channel is in fluid communication with a second pressurized fluid supply port.

* * * * *